United States Patent
Takeoka et al.

(10) Patent No.: US 6,799,292 B2
(45) Date of Patent: Sep. 28, 2004

(54) METHOD FOR GENERATING TEST PATTERN FOR SEMICONDUCTOR INTEGRATED CIRCUIT AND METHOD FOR TESTING SEMICONDUCTOR INTEGRATED CIRCUIT

(75) Inventors: Sadami Takeoka, Osaka (JP); Sudhakar M. Reddy, Iowa City, IA (US); Seiji Kajihara, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 323 days.

(21) Appl. No.: 09/799,583

(22) Filed: Mar. 7, 2001

(65) Prior Publication Data

US 2001/0029593 A1 Oct. 11, 2001

(30) Foreign Application Priority Data

Mar. 8, 2000 (JP) ........................ 2000-062833

(51) Int. Cl.[7] ................................ G01R 31/28
(52) U.S. Cl. ..................... 714/726; 714/738
(58) Field of Search ................. 714/726, 738, 714/733, 720, 718, 736

(56) References Cited

U.S. PATENT DOCUMENTS

| | | | |
|---|---|---|---|
| 5,600,787 A | | 2/1997 | Underwood et al. |
| 5,805,609 A | * | 9/1998 | Mote, Jr. ............ 714/726 |
| 5,825,785 A | * | 10/1998 | Barry et al. ......... 714/732 |
| 5,872,793 A | * | 2/1999 | Attaway et al. ...... 714/726 |
| 5,923,836 A | * | 7/1999 | Barch et al. ......... 714/33 |
| 6,032,278 A | * | 2/2000 | Parvathala et al. ... 714/726 |
| 6,049,901 A | * | 4/2000 | Stock et al. ......... 714/726 |
| 6,070,260 A | * | 5/2000 | Buch et al. .......... 714/731 |
| 6,073,261 A | * | 6/2000 | Miller ................ 714/731 |
| 6,105,156 A | * | 8/2000 | Yamauchi ............ 714/738 |
| 6,158,032 A | * | 12/2000 | Currier et al. ....... 714/726 |
| 6,304,987 B1 | * | 10/2001 | Whetsel, Jr. ......... 714/724 |
| 6,370,664 B1 | * | 4/2002 | Bhawmik ............ 714/729 |
| 6,463,561 B1 | * | 10/2002 | Bhawmik et al. .... 714/733 |
| 6,510,534 B1 | * | 1/2003 | Nadeau-Dostie et al. ... 714/724 |
| 6,532,571 B1 | * | 3/2003 | Gabrielson et al. ... 716/4 |

FOREIGN PATENT DOCUMENTS

JP       9-269959        10/1997

\* cited by examiner

*Primary Examiner*—Guy J. Lamarre
*Assistant Examiner*—Mujtaba Chaudry
(74) *Attorney, Agent, or Firm*—McDermott Will & Emery LLP

(57) ABSTRACT

A path under test is selected from a semiconductor integrated circuit that has been designed by a scan method. A test pattern is generated for the selected path so that the path is sensitized and a signal, passing through the path, changes its level at a time before or after a capture clock pulse is input to the circuit. Next, the test pattern generated is transformed into a normal scan pattern. Also, an expected output value, which should result from the test pattern input, is obtained. Then, the test pattern is input to the path under test and the resultant output value is compared to the expected value. In this manner, the path can be tested in such a manner as to see whether or not any hold error will occur.

6 Claims, 10 Drawing Sheets

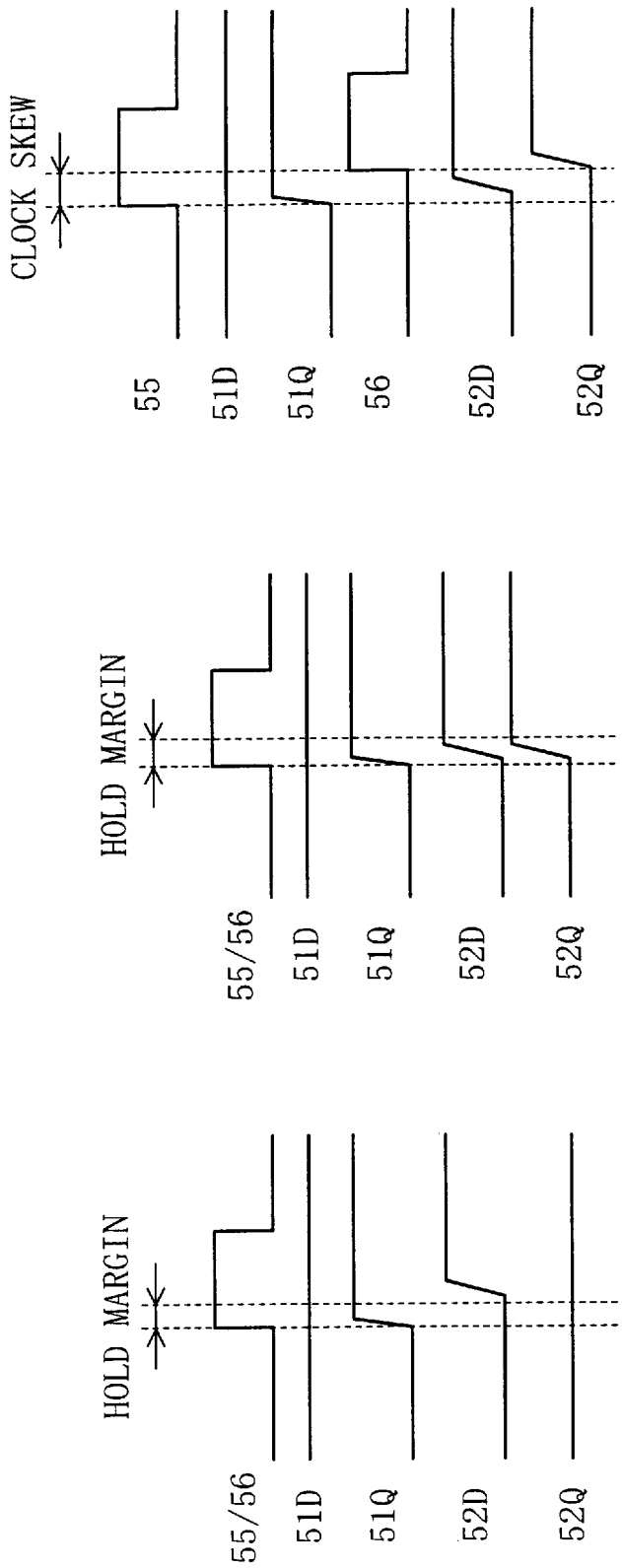

METHOD FOR GENERATING TEST PATTERN FOR SEMICONDUCTOR INTEGRATED CIRCUIT AND METHOD FOR TESTING SEMICONDUCTOR INTEGRATED CIRCUIT

BACKGROUND OF THE INVENTION

The present invention relates to a method for generating a test pattern to identify, by a scan technique, faults (or delays, in particular) that should have been caused in a semiconductor integrated circuit during the fabrication process thereof. The present invention also relates to a method for testing a semiconductor integrated circuit by using the test pattern generated in this manner. More particularly, the present invention is applicable to a fault diagnosis carried out to detect hold errors.

A design rule for semiconductor device processing has been tremendously reduced recently to increase the scale and complexity of a semiconductor integrated circuit steeply, thus making it even more difficult to test such a complicated circuit. To cope with this problem, or to make a semiconductor integrated circuit testable more easily, various techniques, including a scan method, have been developed as means for increasing the testability of a circuit being designed. Thus, it is now possible to identify faults, like those represented as stuck-at fault models, far more efficiently. The capability of detecting a fault supposed as a stuck-at fault model does not depend on the clock frequency. Accordingly, a scan test has normally been carried out at a clock frequency lower than the actual operating frequency of the circuit.

However, the smaller the feature size defined for semiconductor device processing, the more noticeable a process-induced variation. So under the circumstances such as these, it is very hard to test such a complicated circuit reliably enough by the known scan technique that utilizes a low clock frequency. That is to say, a semiconductor integrated circuit now needs to be tested by fully taking a delay into account and using a clock frequency equal to the actual operating frequency of the circuit. A typical example of these new test methods is a pass delay test, which is disclosed in Japanese Laid-Open Publication No. 9-269959, for example.

A path delay test has been performed on a fault model, on which a delay, caused on a signal path, is abnormally long due to a defect occurring during a fabrication process. Specifically, when such a fault happens, a signal, which should normally reach the end point of a signal path within one clock period, cannot arrive there within that period. A fault of this type can usually be identified as a setup error of a flip-flop.

However, no tests have been carried out on a fault model of the opposite type, on which a delay, caused on a signal path, is abnormally short due to a defect occurring during a fabrication process. A fault of this type is usually identifiable as a hold error.

As for a semiconductor integrated circuit subjected to a synchronous design, in particular, the process-induced defect makes the abnormally short delay evident in either of the following two situations. One possibility is (1) that a signal might be unintentionally propagated at a rate much higher than the designed one through a signal path between flip-flops. Or (2) clock lines connected to respective flip-flops might cause skews of variable lengths. When any of these phenomena occurs, a signal cannot be propagated through a path between flip-flops at the intended rate, thus causing a hold error. These two possible factors will be described in further detail with reference to FIG. 12 and FIGS. 13A through 13C.

FIG. 12 illustrates part of a semiconductor integrated circuit. As shown in FIG. 12, the circuit includes two flip-flops 51 and 52, combinatorial circuit 53, signal path 54, clock lines 55 and 56 and clock tree buffers 57 and 58. Each of these flip-flops 51 and 52 includes clock input terminal CK, data input terminal D and data output terminal Q.

FIGS. 13A through 13C are timing diagrams illustrating how the semiconductor integrated circuit shown in FIG. 12 operates. FIG. 13A illustrates a situation where a delay of a normal length is caused on the signal path 54. FIG. 13B illustrates a fault model on which a signal is propagated through the path 54 at a rate higher than the designed one. And FIG. 13C illustrates a situation where a skew has been caused between the clock lines 55 and 56 because of the difference in delay.

As shown in FIG. 13A, the circuit is designed in such a manner that even a shortest delay that could possibly be caused on the signal path 54 is no shorter than the hold margin of the flip-flop 52. In addition, the sizes and positions of the clock tree buffers 57 and 58 are adjusted so as to set the clock skew between the clock lines 55 and 56 to (substantially) zero. However, if the signal has unintentionally been propagated through the path 54 faster than expected (i.e., the situation (1)) due to a process-induced variation or defect of the circuit, then the flip-flop 52 causes a hold error, thus making the circuit operating erroneously as shown in FIG. 13B. Also, even if the delay on the path 54 is of the normal length, a skew might be caused between the clock lines 55 and 56 (i.e., the situation (2)) due to a process-induced variation or defect of the clock tree buffers 57 and 58 or clock lines 55 and 56. In that case, the flip-flop 52 unintentionally latches the output signal of the flip-flop 51 at the non-original level and operates erroneously as shown in FIG. 13C.

Accordingly, if such a fault has occurred in any of the signal paths due to the process-induced defects, a test pattern needs to be generated to identify the fault of the signal path.

SUMMARY OF THE INVENTION

It is therefore an object of the present invention to provide a method for generating a test pattern required for identifying such faults on signal paths and a method for testing a semiconductor integrated circuit using a test pattern of this type.

To achieve this object, the present invention generates a test pattern so that a path under test is sensitized and a signal, passing through the path, changes its level while the path is being sensitized.

Specifically, an inventive test pattern generating method for a semiconductor integrated circuit is used to see whether or not a storage device, located at an end point of a path selected from the circuit, will operate erroneously due to a hold error. The test pattern is generated so that the path is sensitized and a signal, passing through the path, changes its level at a time before or after a clock signal is input to the storage device.

Another inventive test pattern generating method is applicable to a semiconductor integrated circuit, which includes: at least one external input terminal and at least one external output terminal; a plurality of storage devices; and a combinatorial circuit connected to the external input and output terminals and to the storage devices. The method includes the step of a) generating a signal level transition for a path selected from the combinatorial circuit by assigning an initial value and a changed value, which is an inverted version of the initial value, to start and end points of the path, respectively. In this processing step, output terminals of the combinatorial circuit, which are connected to respective input terminals of the storage devices, are regarded as pseudo-external output terminals. On the other hand, input terminals of the combinatorial circuit, which are connected to respective output terminals of the storage devices, are regarded as pseudo-external input terminals. Also, the start point of the selected path is either the at least one external input terminal or one of the pseudo-external input terminals, while the end point of the selected path is one of the pseudo-external output terminals. The method further includes the step of b) assigning value(s) to the at least one external input terminal and/or at least one of the pseudo-external input terminals and justifying the value(s) so as to sensitize the selected path. And the method further includes the step of c) obtaining, as an expected value, a value justified for the end point of the selected path where the initial value assigned to the start point of the path in the step a) has been justified in the step b).

In one embodiment of the present invention, if the start point of the selected path is one of the pseudo-external input terminals, the step a) is preferably performed so that a value, which is assigned to associated one of the pseudo-external output terminals and is obtained from a value input from one of the storage devices that corresponds to the pseudo-external input terminal, is an inverted version of the initial value.

In another embodiment of the present invention, the step b) is preferably performed so that a first value, which needs to be justified to sensitize the path, becomes equal to a second value resulting from a third value. The first value is assigned to one of the pseudo-external input terminals. The second value is assigned to one of the pseudo-external output terminals that is associated with the pseudo-external input terminal. And the third value is input from one of the storage devices that corresponds to the pseudo-external input terminal.

In still another embodiment, the step b) preferably includes the step of assigning value(s) to the at least one external input terminal and/or at least one of the pseudo-external input terminals. The value(s) has/have to be justified to sensitize the path at a time at which a value assigned to the start point of the selected path is equal to the initial value. The step b) preferably further includes the step of determining whether or not the path is still sensitized even after a clock signal has been input to one of the storage devices that is located at the end point of the selected path.

An inventive method for testing a semiconductor integrated circuit includes the step of generating a test pattern for the circuit to see whether or not a hold error will occur at an input terminal of a storage device when a clock signal is input to the storage device. The storage device is located at an end point of a path selected from the circuit. The test pattern is generated so that the path is sensitized and a signal, passing through the path, changes its level at a time before or after the clock signal is input to the storage device. The testing method further includes the steps of: inputting the test pattern to an external terminal of the circuit; monitoring, at another external terminal of the circuit, a resultant output corresponding to the input test pattern; and judging the circuit as GO or NO-GO based on a result of the monitoring step.

According to the present invention, a test pattern is generated so that a path to be tested in a semiconductor integrated circuit is sensitized at a time before or after a clock signal is input to a storage device located at the end point of the path. The test pattern is also generated so that a signal, passing through the path, changes its level while the path is being sensitized. Thus, by testing the circuit using this test pattern, it is possible to see whether or not a fault will occur on the path under test due to a hold error.

BRIEF DESCRIPTION OF THE DRAWINGS

FIGS. 13A through 13C are timing diagrams illustrating how the circuit shown in FIG. 12 may operate:

FIG. 13A illustrates a situation where a delay of a normal length is caused on the signal path;

FIG. 13B illustrates a situation where a signal is propagated through the path at a rate higher than the designed one due to a fault; and FIG. 13C illustrates a situation where a skew is caused due to a variation in delay between clock lines.

DESCRIPTION OF THE PREFERRED EMBODIMENTS

Hereinafter, preferred embodiments of the present invention will be described with reference to the accompanying drawings.

In the following illustrative embodiments, if a path under test passes a component with multiple input terminals, one of those input terminals that is located on the path under test will be herein called an "on-path input terminal", while the other input terminal an "off-path input terminal". Also, for the sake of simplicity, it is supposed that only one type of signal transition "from 0 to 1" should occur at the start point of any path under test, not the other type "from 1 to 0".

Furthermore, in the following description, three paths shown in FIG. 7, namely, (171→G1→175), (173→G4→177) and (174→G5→G6→178) are given as paths under test at the beginning of the process.

Embodiment 1

Figure 1:
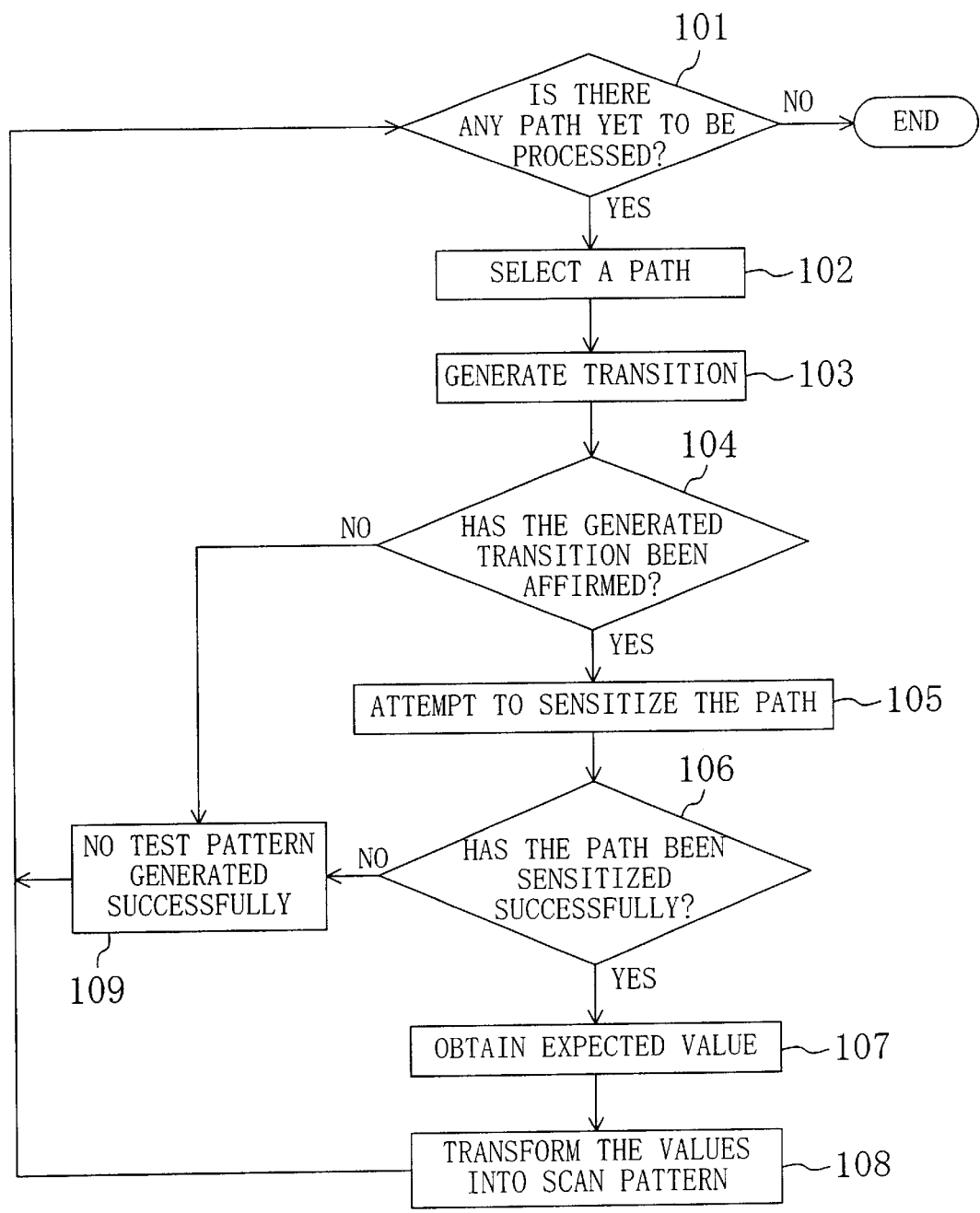
FIG. 1 is a flowchart illustrating an inventive method for generating a test pattern for a semiconductor integrated circuit.

FIG. 1 is a flowchart illustrating an inventive method for generating a test pattern for a semiconductor integrated circuit. As shown in FIG. 1, first, in Step 101, it is determined whether or not there are any paths yet to be processed. If the answer is NO, then the process ends. Otherwise, the process advances to the next step 102, in which one of those unprocessed paths is selected. Then, in Step 103, an imaginable signal level transition is generated for the path selected in Step 102. Subsequently, in Step 104, it is determined whether or not the level transition generated in Step 103 has been affirmed. If the answer is YES, the selected path is tentatively sensitized in Step 105. Otherwise, it is decided in Step 109 that no test pattern could be generated successfully for the selected path under test, and the process returns to Step 101. Thereafter, in Step 106, it is determined whether or not the attempted path sensitization was successful in Step 105. If the answer is YES, then an expected value to be compared to the test result on the path is obtained in Step 107. Otherwise, it is decided in Step 109 that no test pattern could be generated successfully for the selected path under test, and the process returns to Step 101. Finally, in Step 108, the input values produced in Steps 103 and 105 and the expected value obtained in Step 107 are transformed into a scan pattern.

Figure 2:
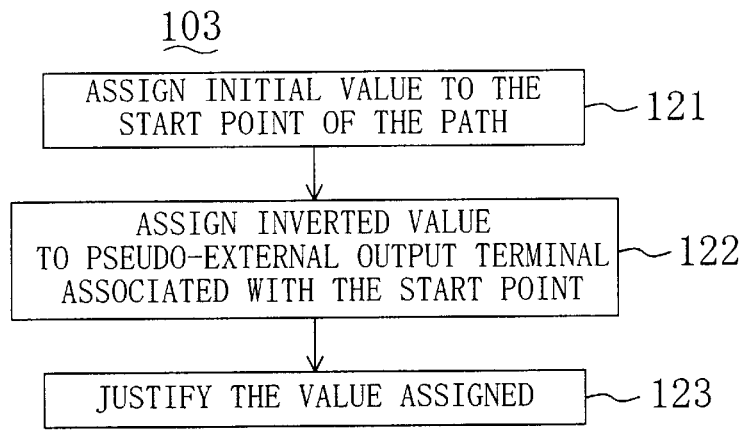
FIG. 2 is a flowchart illustrating the details of the transition generating step 103 shown in FIG. 1.

FIG. 2 is a flowchart illustrating the details of Step 103 shown in FIG. 1. As shown in FIG. 2, first, in Step 121, an initial value is assigned to the start point of the path selected in Step 102. Next, in Step 122, the inverted version of the initial value is assigned to a pseudo-external output terminal associated with the start point of the path. Then, in Step 123, the value assigned in Step 122 is justified to see if this value and the other at associated input terminals realize the intended logic. The inverted version of the initial value is assigned in Step 122 to the pseudo-external output terminal associated with the start point of the path, because a flip-flop corresponding to the start point inverts an input value responsive to a clock pulse.

Figure 3:
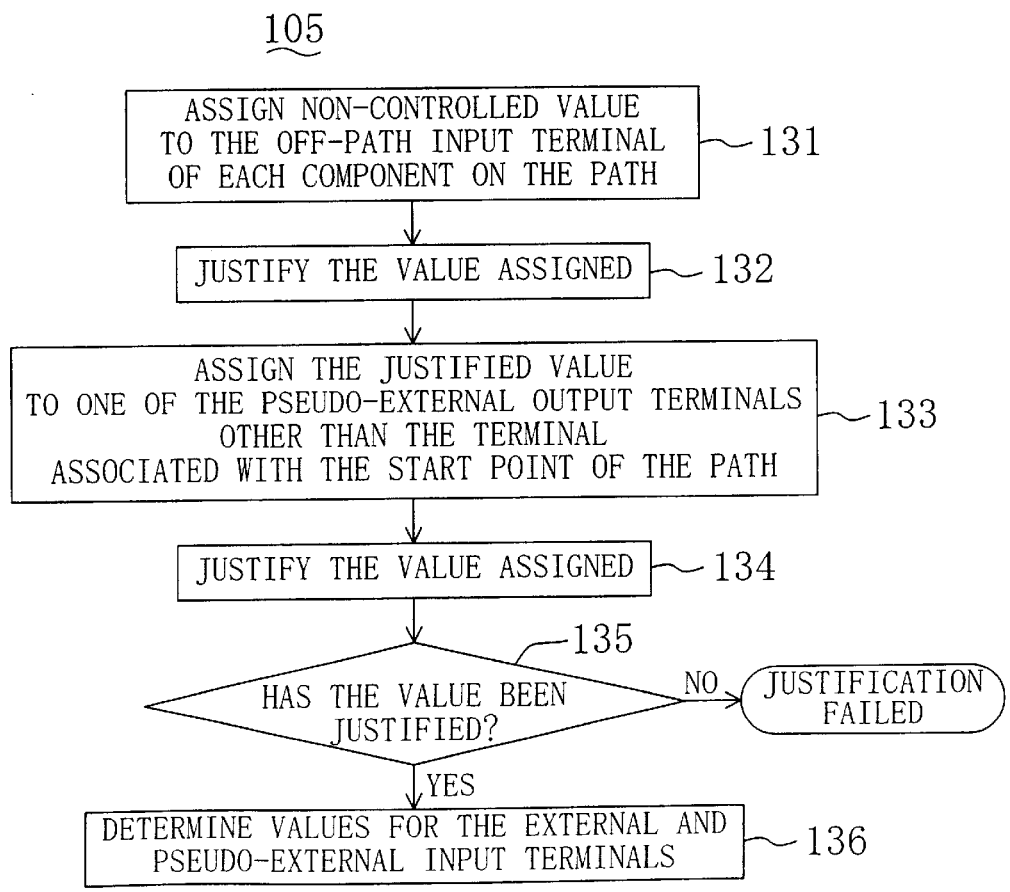
FIG. 3 is a flowchart illustrating the details of a path sensitizing step 105 according to a first embodiment of the present invention.

FIG. 3 is a flowchart illustrating the details of Step 105 shown in FIG. 1. As shown in FIG. 3, first, in Step 131, a non-controlled value is assigned to the off-path input terminal of at least one component on the selected path. Next, in Step 132, the value assigned in Step 131 is justified to see if this value and the other value at associated input terminals realize the intended logic. Then, in Step 133, the value justified in Step 132 is assigned to a pseudo-external output terminal other than that associated with the start point of the path. These processing steps 131, 132 and 133 are performed to determine respective values for the external and/or pseudo-external input terminals. Thereafter, in Step 134, the value assigned to the pseudo-external output terminal in the previous step 133 is justified to see if this value and the other value at associated input terminals realize the intended logic. Subsequently, in Step 135, it is determined whether or not that value has been successfully justified in Step 134. If the answer is YES, then a unique set of values are determined for the external and pseudo-external input terminals in Step 136.

Figure 6:
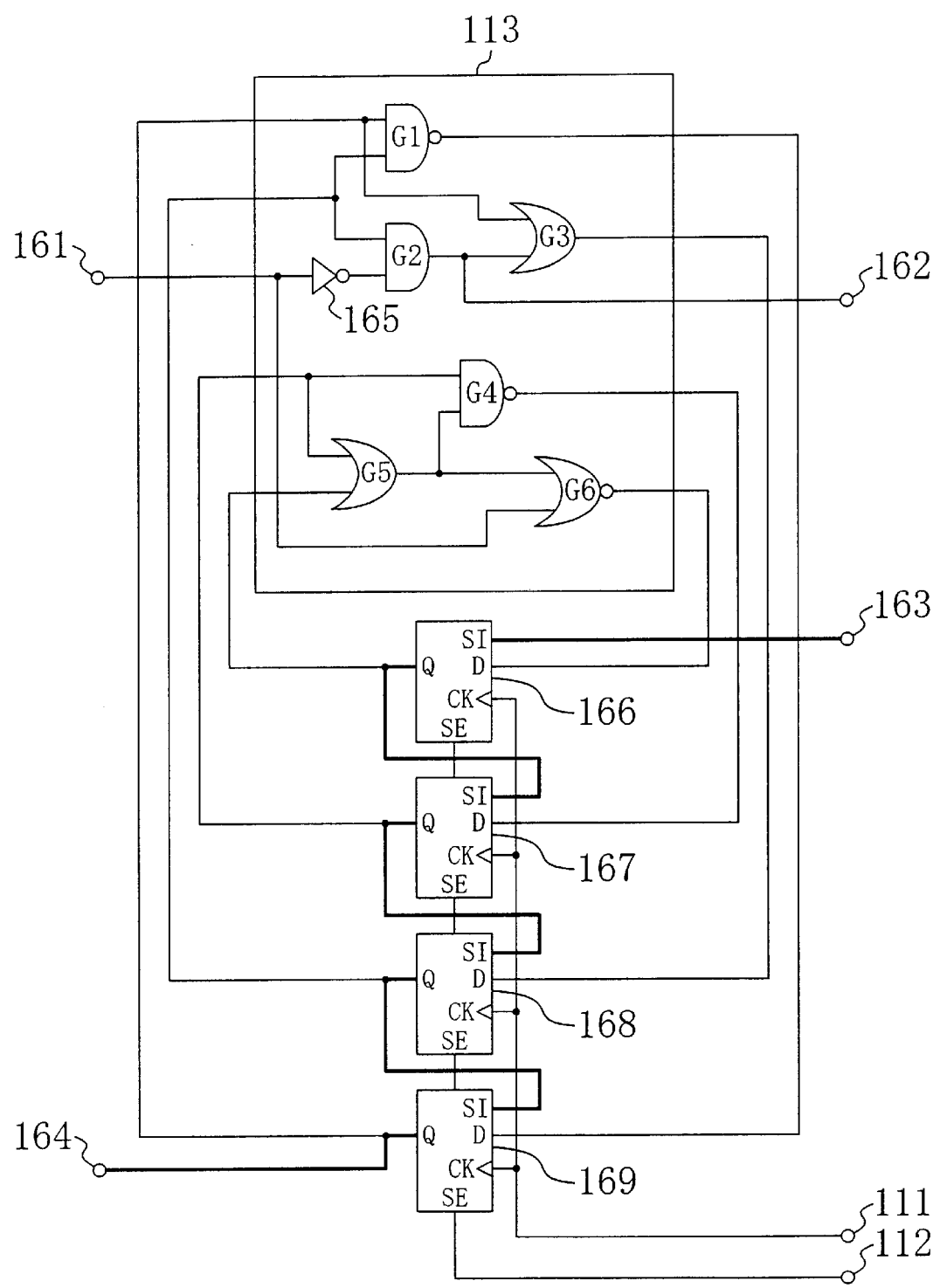
FIG. 6 is a circuit diagram of an exemplary semiconductor integrated circuit for use in illustrating the embodiments of the inventive test pattern generating method.

FIG. 6 shows a circuit diagram for use in illustrating an inventive method for generating a test pattern for a semiconductor integrated circuit. As shown in FIG. 6, the circuit includes clock, scan-enable, external input, external output, scan-in and scan-out terminals 111, 112, 161, 162, 163 and 164, combinatorial circuit 113 and scan flip-flops 166, 167, 168 and 169. The flip-flops 166 through 169 are exemplary storage devices as defined in the appended claims. The combinatorial circuit 113 includes inverter 165, NAND gates G1 and G4, AND gate G2, OR gates G3 and G5 and NOR gate G6. The flip-flops 166 through 169 are scan-connected in this order between the scan-in and scan-out terminals 163 and 164. When "1" is input thereto through the scan-enable terminal 112, the flip-flops 166 through 169 together operates as a shift register synchronously with the leading edge of a clock signal supplied through the clock terminal 111. On the other hand, if "0" is input thereto through the scan-enable terminal 112, then the flip-flops 166 through 169 operate as normal flip-flops, each latching a signal at the D-input terminal thereof and outputting the latched signal through the Q-terminal thereof.

Figure 7:
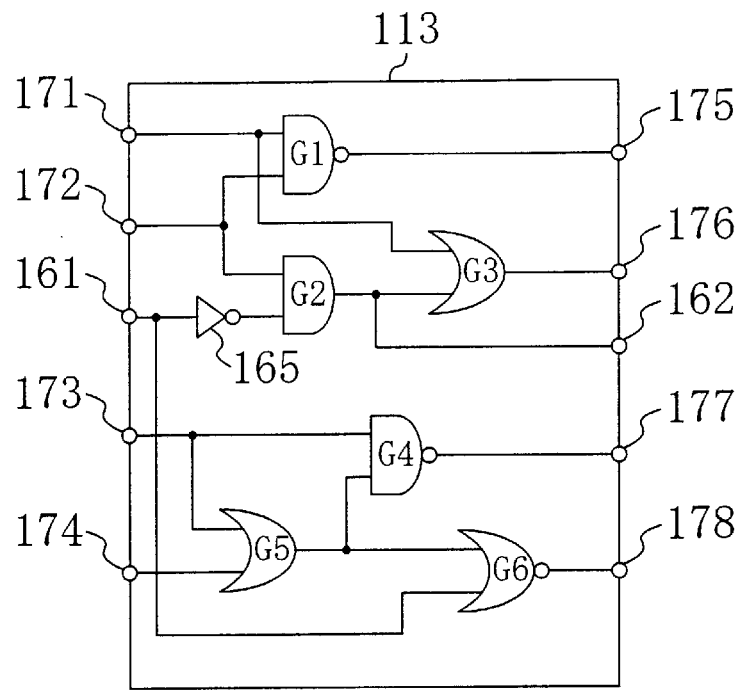
FIG. 7 is a circuit diagram showing a main section of the circuit shown in FIG. 6 to illustrate the embodiments of the inventive test pattern generating method.

FIG. 7 illustrates a circuit diagram in which the outputs and inputs of the flip-flops 166 through 169 are replaced with pseudo-external inputs and outputs, respectively. As shown in FIG. 7, the pseudo-external inputs are received at input terminals 171, 172, 173 and 174, respectively, while the pseudo-external outputs go out through output terminals 175, 176, 177 and 178, respectively. Each component shown in both of FIGS. 6 and 7 is identified by the same reference numeral or sign. In FIG. 7, the pseudo-external input and output terminals 171 and 175 respectively correspond to the output and input of one flip-flop 169. The input and output terminals 172 and 176 respectively correspond to the output and input of another flip-flop 168. The input and output terminals 173 and 177 respectively correspond to the output and input of still another flip-flop 167. And the input and output terminals 174 and 178 respectively correspond to the output and input of the other flip-flop 166.

Hereinafter, an inventive method for generating a test pattern for a semiconductor integrated circuit will be described with reference to FIGS. 1, 2, 3, 6 and 7.

First, in Step 101, three paths yet to be processed, namely, (171→G1→175), (173→G4→177) and (174→G5→G6→178), are given in the illustrated example. So in the next step 102, one of these paths, e.g., (171→G1→175), is arbitrarily selected.

Then, Step 103 is performed. Specifically, first, in Step 121, an initial value of "0" is assigned to the start point of the selected path, i.e., the pseudo-external input terminal 171. Next, in Step 122, the inverted version "1" of the initial value "0" is tentatively assigned to the pseudo-external output terminal 175 associated with the start point 171 of the path. Then, in Step 123, the value "1" assigned to the pseudo-external output terminal 175 in the previous step 122 is justified to see if this value "1" and the other at associated input terminals realize the intended NAND logic. In the illustrated example, "0" has been assigned to the pseudo-external input terminal 171 in Step 121, so the value "1" for the pseudo-external output terminal 175 is justifiable and is not contradictory to the intended NAND logic.

Subsequently, in Step 104, it is decided that the generated signal level transition has been affirmed as a result of Steps 121 through 123. Accordingly, the selected path is tentatively sensitized in the next step 105. In this step 105, first, a non-controlled value of "1" is assigned in Step 131 to the off-path input terminal of the component G1 on the selected path. Next, in Step 132, this value "1" assigned to the off-path input terminal in the previous step 131 is justified to see if this value and the value at the associated input terminal 172 realize the intended NAND logic. In the illustrated example, the off-path input terminal of the component G1 is directly connected to the pseudo-external input terminal 172, so the value for the pseudo-external input terminal 172 is equal to that for the off-path input terminal. And the value "1" assigned to the off-path input terminal and pseudo-external input terminal 172 meets the intended NAND logic. Thus, the non-controlled value "1" assigned in Step 131 has been justified. Then, in Step 133, the value "1" justified for the pseudo-external input terminal 172 in the previous step 132 is assigned to the pseudo-external output terminal 176 associated with the pseudo-external input terminal 172. Next, in Step 134, this value "1" assigned to the pseudo-external output terminal 176 in the previous step 133 is justified to see if this value and the other value at the associated input terminals realize the intended AND and OR logic. In the illustrated example, one of the input terminals of the OR gate G3 is directly connected to the pseudo-external input terminal 171, so the value for the former input terminal should be "0" that has been assigned to the pseudo-external input terminal 171 in Step 121. Accordingly, to realize the intended OR logic, the value for the other input terminal of the OR gate G3 must be "1". And the two inputs of the AND gate G2 should be both "1" to realize the intended AND logic. As a result, the value "1" assigned to the pseudo-external output terminal 176 in the previous step 133 has been justified, and the value for the external input terminal 161 turns out to be "0", because the inverter 165 exists between the terminal 161 and the AND gate G2. Consequently, in Step 135, it is decided that the value "1" assigned to the pseudo-external output terminal 176 in Step 133 has been successfully justified in Step 134. In this manner, the input values for the pseudo-external and external input terminals 171, 172 and 161 are determined in Step 136 as "0", "1" and "0", respectively.

Thereafter, in Step 106, it is decided that the attempted path sensitization was successful as a result of Steps 131 through 136. Thus, the process advances to the next Step 107 to obtain an expected value. In this Step 107, the value "1" justified for the pseudo-external output terminal 175, or the end point of the selected path, is adopted as the expected value of the selected path (171→G1→175).

Finally, in Step 108, the values "0", "1", "0" and "1" determined in Steps 105 and 107 for the pseudo-external and external input terminals 171, 172 and 161 and pseudo-external output terminal 175, respectively, are transformed into a scan pattern. In this manner, a test pattern, applicable to the original circuit shown in FIG. 6, is generated. In the illustrated example, the pseudo-external input and output terminals 171, 172 and 175 correspond to the outputs of the scan flip-flops 169 and 168 and the input of the scan flip-flop 169, respectively. Accordingly, considering the connection order of the scan chain (i.e., scan-in terminal 163→scan flip-flops 166, 167, 168 and 169→scan-out terminal 164), the scan pattern is transformed as shown in the following Table 1:

TABLE 1

|        | 111 | 112 | 161 | 163 | 164 |
|--------|-----|-----|-----|-----|-----|
| Time 1 | ↑   | 1   | 0   | 0   | —   |
| Time 2 | ↑   | 1   | 0   | 1   | —   |
| Time 3 | ↑   | 1   | 0   | X   | —   |
| Time 4 | ↑   | 1   | 0   | X   | —   |
| Time 5 | ↑   | 0   | 0   | X   | 1   |

In Table 1, "↑" represents the leading edge of a clock pulse, "X" represents don't care, and "-" represents no reference to the expected value.

Thereafter, the process returns to Step 101. At this time, there are two more paths yet to be processed, namely, (173→G4→177) and (174→G5→G6→178) in the illustrated example. So in the next step 102, one of these paths, e.g., (173→G4→177), is arbitrarily selected.

Then, Step 103 is performed. Specifically, first, in Step 121, an initial value of "0" is assigned to the start point of the selected path, i.e., the pseudo-external input terminal 173. Next, in Step 122, the inverted version "1" of the initial value "0" is tentatively assigned to the pseudo-external output terminal 177 associated with the start point 173 of the path. Then, in Step 123, the value "1" assigned to the pseudo-external output terminal 177 in the previous step 122 is justified to see if this value "1" and the other at associated input terminals realize the intended NAND logic. In the illustrated example, "0" has been assigned to the pseudo-external input terminal 173 in Step 121, so the value "1" for the pseudo-external output terminal 177 is justifiable and is not contradictory to the intended NAND logic.

Subsequently, in Step 104, it is decided that the generated signal level transition has been affirmed as a result of Steps 121 through 123. Accordingly, the selected path is tentatively sensitized in the next step 105. In this step 105, first, a non-controlled value of "1" is assigned in Step 131 to the off-path input terminal of the NAND gate G4 on the selected path. Next, in Step 132, this value "1" assigned to the off-path input terminal in the previous step 131 is justified to see if this value and the other values at the associated input terminals 173 and 174 realize the intended OR logic. In the illustrated example, the off-path input terminal of the NAND gate G4 is connected to the output terminal of the OR gate G5. And one of the input terminals of the OR gate G5 is connected to the pseudo-external input terminal 173, to which the value "0" has already been assigned in Step 121. Thus, to realize the intended OR logic, the value for the other input terminal of the OR gate G5 (i.e., that for the pseudo-external input terminal 174) should be "1". Thus, the non-controlled value "1" assigned in Step 131 has been justified. Then, in Step 133, the value "1" justified for the pseudo-external input terminal 174 in the previous step 132 is assigned to the pseudo-external output terminal 178 associated with the pseudo-external input terminal 174. Next, in Step 134, this value "1" assigned to the pseudo-external output terminal 178 in the previous step 133 is justified to see if this value and the other values at the associated input terminals realize the intended NOR and OR logic. In the illustrated example, one of the input terminals of the NOR gate G6 is connected to the output terminal of the OR gate G5, to which the value "1" has been assigned in Step 131. Since this value "1" is contradictory to the intended NOR logic, it is decided in Step 135 that the value "1" assigned to the pseudo-external output terminal 178 in Step 133 could not be successfully justified in Step 134.

Accordingly, in Step 106, it is decided that the attempted path sensitization failed as a result of Step 105. Thus, the process advances to Step 109 to conclude that no test pattern could be generated successfully for the path (173→G4→177).

And the process returns to Step 101 again. At this time, there is just one path yet to be processed, i.e., (174→G5→G6→178) in the illustrated example. So in the next step 102, this path (174→G5→G6→178) is selected.

Then, Step 103 is performed. Specifically, first, in Step 121, an initial value of "0" is assigned to the start point of the selected path, i.e., the pseudo-external input terminal 174. Next, in Step 122, the inverted version "1" of the initial value "0" is tentatively assigned to the pseudo-external output terminal 178 associated with the start point 174 of the path. Then, in Step 123, this value "1" assigned to the pseudo-external output terminal 178 in the previous step 122 is justified to see if this value "1" and the other value at associated input terminals 161, 173 and 174 realize the intended OR and NOR logic. In the illustrated example, the output terminal of the NOR gate G6 is connected to the pseudo-external output terminal 178, so the two inputs of the NOR gate G6 should both be "0". Accordingly, to realize the intended OR logic, the two inputs of the OR gate G5, which is connected to one of the input terminals of the NOR gate G6, both must be "0", too. As a result, the values for the external and pseudo-external input terminals 161, 173 and 174 should all be "0", which is not contradictory to the value "0" assigned to the pseudo-external input terminal 174 in Step 121. That is to say, the value "1" assigned to the pseudo-external output terminal 178 in Step 122 has been justified.

Subsequently, in Step 104, it is decided that the generated signal level transition has been affirmed as a result of Steps 121 through 123. Accordingly, the selected path is tentatively sensitized in the next step 105. In this step 105, first, a non-controlled value of "0" is assigned in Step 131 to the respective off-path input terminals of the OR and NOR gates G5 and G6 on the selected path. Next, in Step 132, this value "0" assigned in the previous step 131 is justified to see if this value and the other value at the associated input terminals 161, 173 and 174 realize the intended OR and NOR logic. In the illustrated example, the off-path input terminals of the OR and NOR gates G5 and G6 are connected to the pseudo-external and external input terminals 173 and 161, respectively. Thus, the value "0" assigned to the off-path input terminals, or the pseudo-external and external input terminals 173 and 161, has been justified, because the intended OR and NOR logic is realized. Then, in Step 133, the value "0" justified for the pseudo-external input terminal 173 in the previous step 132 is assigned to the pseudo-external output terminal 177 associated with the pseudo-external input terminal 173. Next, in Step 134, this value "0" assigned to the pseudo-external output terminal 177 in the previous step 133 is justified to see if this value and the other value at the associated input terminals 173 and 174 realize the intended NAND and OR logic. In the illustrated example, the pseudo-external output terminal 177 is connected to the output terminal of the NAND gate G4. However, the two input values of the NAND gate G4 were both set to "0" in Steps 131 and 132, so the value "0" assigned to the pseudo-external output terminal 177 in Step 134 is contradictory to the intended NAND logic. As a result, it is decided in Step 135 that the value "0" assigned to the pseudo-external output terminal 177 in Step 133 could not be successfully justified in Step 134.

Accordingly, in Step 106, it is decided that the attempted path sensitization failed as a result of Step 105. Thus, the process advances to Step 109 to conclude that no test pattern could be generated successfully for the path (174→G5→G6→178).

Then, the process returns to Step 101 again, but there is no path yet to be processed. So the process ends.

By performing the foregoing steps, a test pattern could be generated successfully for only the path (171→G1→175) out of the three paths given, or (171→G1→175), (173→G4→177) and (174→G5→G6→178).

Figure 8:
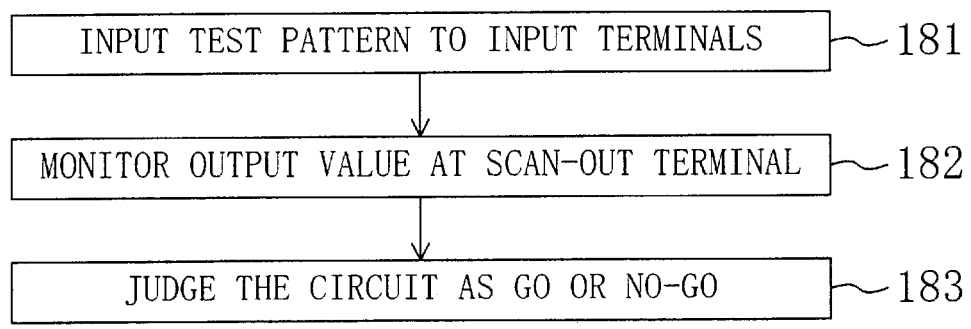
FIG. 8 is a flowchart illustrating respective processing steps for testing a semiconductor integrated circuit in accordance with the present invention.

Next, it will be described with reference to FIGS. 6, 8 and 9 how to test the semiconductor integrated circuit shown in FIG. 6 using a test pattern generated in this manner. FIG. 8 is a flowchart illustrating respective processing steps for testing the circuit shown in FIG. 6. As shown in FIG. 8, first, in Step 181, the test pattern is input to the four input terminals, namely, the clock, scan-enable, external input and scan-in terminals 111, 112, 161 and 163. Next, in Step 182, an output value is monitored at the scan-out terminal 164.

Then, in Step 183, the semiconductor integrated circuit under test is judged as GO or NO-GO. FIG. 9 is a timing diagram illustrating waveforms at respective terminals where the test pattern generated is applied to the circuit shown in FIG. 6 following the procedure shown in FIG. 8. In FIG. 9, the waveform of each terminal shown in FIG. 6 is identified by its own reference numeral. It should be noted that G1 represents the waveform at the output terminal of the NAND gate G1.

As described above, first, in Step 181, the test pattern generated is input to the clock, scan-enable, external input and scan-in terminals 111, 112, 161 and 163.

Hereinafter, it will be described with reference to FIG. 9 how the semiconductor integrated circuit operates responsive to this test pattern. As shown in FIG. 9, the circuit is performing a scan-in operation while the signal level at the scan-enable terminal 112 is "1". And when the signal level at the scan-enable terminal 112 falls to zero, the circuit finishes the scan-in operation and restarts its normal operation. At this point in time, the Q outputs of the scan flip-flops 168 and 169 are "1" and "0", respectively, so the path (169Q→G1→169D) (which is equivalent to the path (171→G1→175) shown in FIG. 7) is now sensitized. On the other hand, the D inputs of the scan flip-flops 168 and 169 are both "1" at this time. When a clock pulse (labeled as "capture clock" in FIG. 8) is input in such a state, the Q output of the scan flip-flop 169 rises from "0" to "1", but the Q output of the scan flip-flop 168 remains "1". As a result, the signal level transition of "from zero to one" is propagated while the path (169Q→G1→169D) is still being sensitized. This zero-to-one transition corresponds to a one-to-zero transition at the D input terminal of the scan flip-flop 169, which is the end point of the path (169→G1→169D). Normally, the Q output of the scan flip-flop 169 is one when the capture clock pulse is input thereto. However, if the transition propagated through the path (169Q→G1→169D) is not latched successfully at the end point of the path, i.e., the D input terminal of the scan flip-flop 169, then a hold error occurs. That is to say, since the changed value "0", not the original level "1", is latched erroneously at the D input terminal of the scan flip-flop 169, the Q output of the scan flip-flop 169 becomes "0". Accordingly, the Q output of the scan flip-flop 169 is normally "1", but is "0" should the hold error have occurred.

Figure 9:
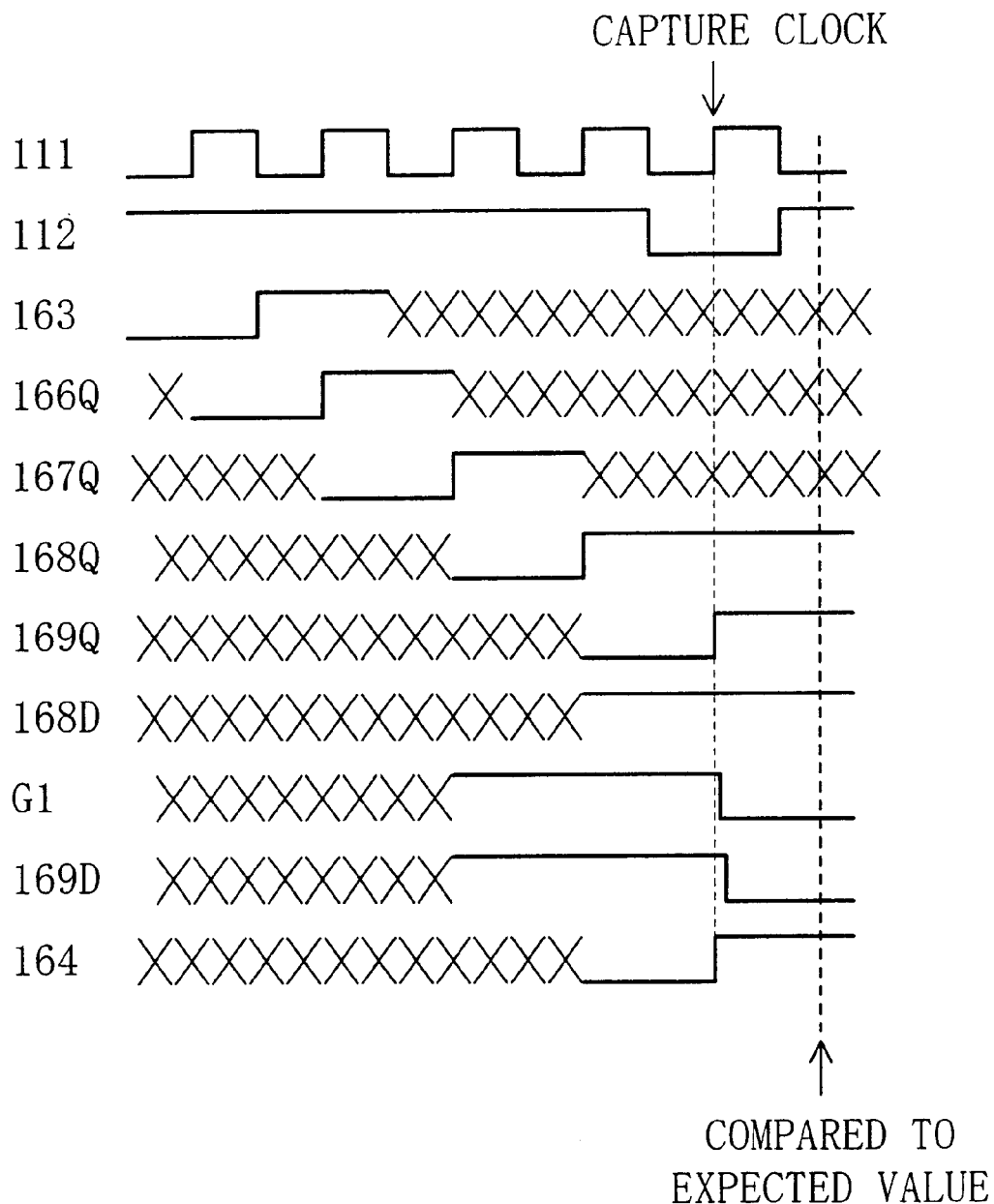
FIG. 9 is a timing diagram for use in illustrating the first embodiment of the inventive testing method.

Next, in Step 182, the signal level at the scan-out terminal 164 is monitored by performing a scan-out operation (as indicated by "compared to expected value" in FIG. 9). If the level monitored at the scan-out terminal 164 is the same as the expected value "1", then the circuit under test is judged as a GO in Step 183. Alternatively, if the monitored level is "0" as opposed to the expected value, then the circuit under test is judged as a NO-GO.

By performing these processing steps in this manner, even if an error has occurred on the selected path (169Q→G1→169D) due to a process-induced defect, the fault can be identified.

Embodiment 2

Figure 4:
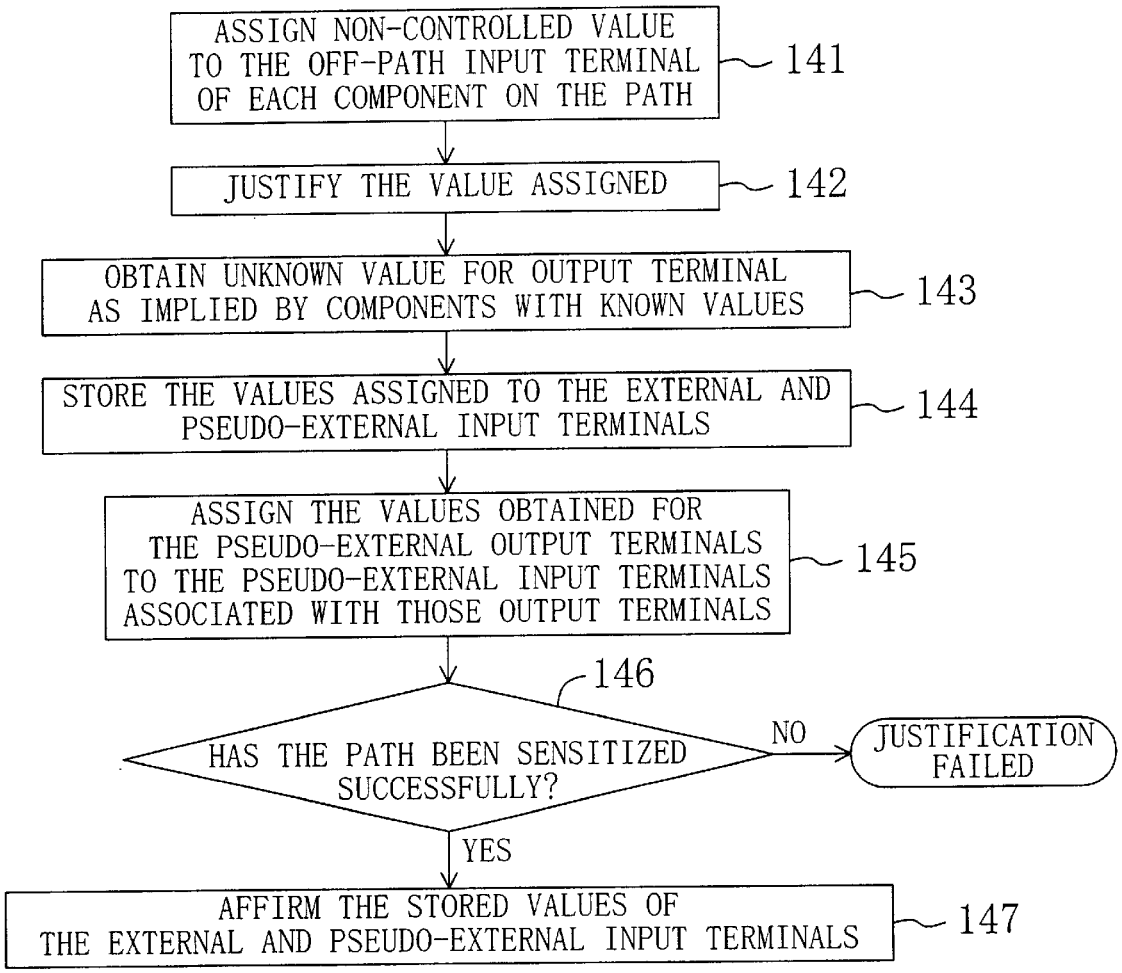
FIG. 4 is a flowchart illustrating the details of a path sensitizing step 105' according to a second embodiment of the present invention.

FIG. 4 is a flowchart detailing an alternative embodiment for the path sensitizing step 105 shown in FIG. 1. It should be noted that Steps 141 and 142 are equivalent to Steps 131 and 132 of the first embodiment.

As shown in FIG. 4, the path sensitizing step 105' of the second embodiment further includes Steps 143, 144, 145, 146 and 147. Specifically, in Step 143, an unknown value for an output terminal is obtained as implied by components with known values. Next, in Step 144, the values assigned to the external and pseudo-external input terminals, which have already been known at this time, are temporarily stored. Then, in Step 145, the values obtained for the pseudo-external output terminals are assigned to the pseudo-external input terminals associated with those output terminals. These processing steps 143, 144 and 145 are performed to determine values for the external and pseudo-external input terminals. Subsequently, in Step 146, it is determined whether or not the given path has been sensitized successfully using the values assigned in the previous step 145. If the answer is YES, then the values, assigned to the external and pseudo-external input terminals and then temporarily stored in Step 144, are affirmed.

Hereinafter, a method for generating a test pattern for a semiconductor integrated circuit according to the second embodiment of the present invention will be described with reference to FIGS. 1, 2, 4, 6 and 7.

It should be noted that this second embodiment attempts to generate a test pattern for the remaining two paths (173→G4→177) and (174→G5→G6→178), for which no test pattern can be generated successfully according to the first embodiment.

First, in Step 101, it is found that there are two paths yet to be processed, namely, (173→G4→177) and (174→G5→G6→178) in the illustrated example. So in the next step 102, one of these paths, e.g., (173→G4→177), is arbitrarily selected.

Then, Step 103 is performed. Specifically, first, in Step 121, an initial value of "0" is assigned to the start point of the selected path, i.e., the pseudo-external input terminal 173. Next, in Step 122, the inverted version "1" of the initial value "0" is tentatively assigned to the pseudo-external output terminal 177 associated with the start point 173 of the path. Then, in Step 123, the value "1" assigned to the pseudo-external output terminal 177 in the previous step 122 is justified to see if this value "1" and the other value at associated input terminals realize the intended NAND logic. In the illustrated example, "0" has been assigned to the pseudo-external input terminal 173 in Step 121, so the value "1" assigned to the pseudo-external output terminal 177 is justifiable and is not contradictory to the intended NAND logic.

Subsequently, in Step 104, it is decided that the generated signal level transition has been affirmed as a result of Steps 121 through 123. Accordingly, the selected path is tentatively sensitized in the next step 105'. In this step 105', first, a non-controlled value of "1" is assigned in Step 141 to the off-path input terminal of the NAND gate G4 on the selected path. Next, in Step 142, this value "1" assigned to the off-path input terminal in the previous step 141 is justified to see if this value and the other value at the associated input terminals 173 and 174 realize the intended OR logic. In the illustrated example, the off-path input terminal of the NAND gate G4 is connected to the output terminal of the OR gate G5. And one of the input terminals of the OR gate G5 is connected to the pseudo-external input terminal 173, to which the value "0" has already been assigned in Step 121. Thus, to realize the intended OR logic, the value at the other input terminal of the OR gate G5 (i.e., the value at the pseudo-external input terminal 174) should be "1". In this manner, the non-controlled value "1" assigned in Step 141 has been justified. Then, in Step 143, an unknown value for the pseudo-external output terminal 178 is determined as implied by the values "0" and "1" assigned to the pseudo-external input terminal 173 and the output terminal of the OR gate G5 in Steps 121 and 141, respectively. As a result, the unknown value for the pseudo-external output terminal 178 turns out to be "1". Next, in Step 144, the values "0" and "1", which have already been known at this point in time and assigned to the pseudo-external input terminals 173 and 174, respectively, are temporarily stored. Subsequently, in Step 145, the values "0" and "1", which have been determined for the pseudo-external output terminals 177 and 178 as a result of Step 143, are assigned to the associated pseudo-external input terminals 173 and 174, respectively. In this case, the output of the OR gate G5 will be "1", so the path (173→G4→177) is now being sensitized. Thus, it is decided in the next step 146 that the path is being sensitized. Then, the process advances to Step 147, in which the values "0" and "1", which were temporarily stored in Step 144, are finally affirmed as the values for the pseudo-external input terminals 173 and 174, respectively.

Accordingly, in Step 106, it is decided that the attempted path sensitization was successful as a result of Steps 141 through 147. Thus, the process advances to Step 107 to obtain an expected value. Specifically, in Step 107, the value "1", justified in Step 122 for the pseudo-external output terminal 177 located at the end point of the selected path, is adopted as the expected value of the path (173→G4→177).

Finally, in Step 108, the values "0", "1" and "1" determined for the pseudo-external input and output terminals 173, 174 and 177, respectively, in Steps 105 and 107 are transformed into a scan pattern. In this manner, a test pattern, applicable to the original circuit shown in FIG. 6, is generated. In the illustrated example, the pseudo-external input and output terminals 173, 174 and 177 correspond to the outputs of the scan flip-flops 167 and 166 and the input of the scan flip-flop 167, respectively. Accordingly, considering the connection order of the scan chain (i.e., scan-in terminal 163→scan flip-flops 166, 167, 168 and 169→scan-out terminal 164), the scan pattern is transformed as shown in the following Table 2:

TABLE 2

| | 111 | 112 | 161 | 163 | 164 |
|---|---|---|---|---|---|
| Time 1 | ↑ | 1 | X | X | — |
| Time 2 | ↑ | 1 | X | X | — |
| Time 3 | ↑ | 1 | X | 0 | — |
| Time 4 | ↑ | 1 | X | 1 | — |
| Time 5 | ↑ | 0 | X | X | — |
| Time 6 | ↑ | 1 | X | X | — |
| Time 7 | ↑ | 1 | X | X | 1 |

In Table 2, "↑" represents the leading edge of a clock pulse, "X" represents don't care, and "-" represents no reference to the expected value.

Among these scan patterns, the patterns for Times 1 and 2 are omissible. Accordingly, the scan pattern may be transformed as shown in the following Table 3:

TABLE 3

| | 111 | 112 | 161 | 163 | 164 |
|---|---|---|---|---|---|
| Time 1 | ↑ | 1 | X | 0 | — |
| Time 2 | ↑ | 1 | X | 1 | — |
| Time 3 | ↑ | 0 | X | X | — |
| Time 4 | ↑ | 1 | X | X | — |
| Time 5 | ↑ | 1 | X | X | 1 |

And the process returns to Step 101 again. At this time, there is just one path yet to be processed, i.e., (174→G5→G6→178) in the illustrated example. So in the next step 102, this path (174→G5→G6→178) is selected.

Then, Step 103 is performed. Specifically, first, in Step 121, an initial value of "0" is assigned to the start point of the selected path, i.e., the pseudo-external input terminal 174. Next, in Step 122, the inverted version "1" of the initial value "0" is tentatively assigned to the pseudo-external output terminal 178 associated with the start point 173 of the path. Then, in Step 123, the value "1" assigned to the pseudo-external output terminal 178 in the previous step 122 is justified to see if this value "1" and the other value at associated input terminals 161, 173 and 174 realize the intended OR and NOR logic. In the illustrated example, the output terminal of the NOR gate G6 is connected to the pseudo-external output terminal 178, so the two inputs of the NOR gate G6 should both be "0". Accordingly, to realize the intended OR logic, the two inputs of the OR gate G5, which is connected to one of the input terminals of the NOR gate G6, both must be "0", too. As a result, the values at the external and pseudo-external input terminals 161, 173 and 174 should all be "0", which is not contradictory to the value "0" assigned to the pseudo-external input terminal 174 in Step 121. That is to say, the value "1" assigned to the pseudo-external output terminal 178 in Step 122 has been justified.

Subsequently, in Step 104, it is decided that the generated signal level transition has been affirmed as a result of Steps 121 through 123. Accordingly, the selected path is tentatively sensitized in the next step 105'. In this step 105', first, a non-controlled value of "0" is assigned in Step 141 to the respective off-path input terminals of the OR and NOR gates G5 and G6 on the selected path. Next, in Step 142, this non-controlled value "0" assigned in the previous step 141 is justified to see if this value and the other value at the associated input terminals 161, 173 and 174 realize the intended OR and NOR logic. In the illustrated example, the off-path input terminals of the OR and NOR gates G5 and G6 are connected to the pseudo-external and external input terminals 173 and 161, respectively. Thus, the value "0" assigned to the pseudo-external and external input terminals 173 and 161 has been justified, because the intended OR and NOR logic is realized. Then, in Step 143, an unknown value for the pseudo-external output terminal 177 is obtained as implied by the value "0" assigned to the pseudo-external input terminal 174 in Step 121 and to the pseudo-external and external input terminals 173 and 161 in Step 141, respectively. As a result, the unknown value for the pseudo-external output terminal 177 turns out to be "1". Next, in Step 144, the value for the pseudo-external input terminals 173 and 174, which has already been known at this point in time, is temporarily stored. Subsequently, in Step 145, the value "1", which has been determined for the pseudo-external output terminals 177 and 178 as a result of Step 143, is assigned to the associated pseudo-external input terminals 173 and 174. In this case, the value for the off-path input terminal of the OR gate G5 will be "1", so the path (174→G5→G6→178) cannot be sensitized. Thus, it is decided in the next step 146 that the path could not be sensitized successfully.

Accordingly, in Step 106, it is decided that the attempted path sensitization failed as a result of Step 105. Thus, the process advances to Step 109 to conclude that no test pattern could be generated successfully for the path (174→G5→G6→178).

Then, the process returns to Step 101 again, but there is no path yet to be processed. So the process ends.

By performing the foregoing processing steps of the second embodiment, a test pattern can be generated successfully for only the path (173→G4→177) out of the two paths (173→G4→177) and (174→G5→G6→178), for which no test pattern can be generated successfully by the first embodiment.

Figure 10:
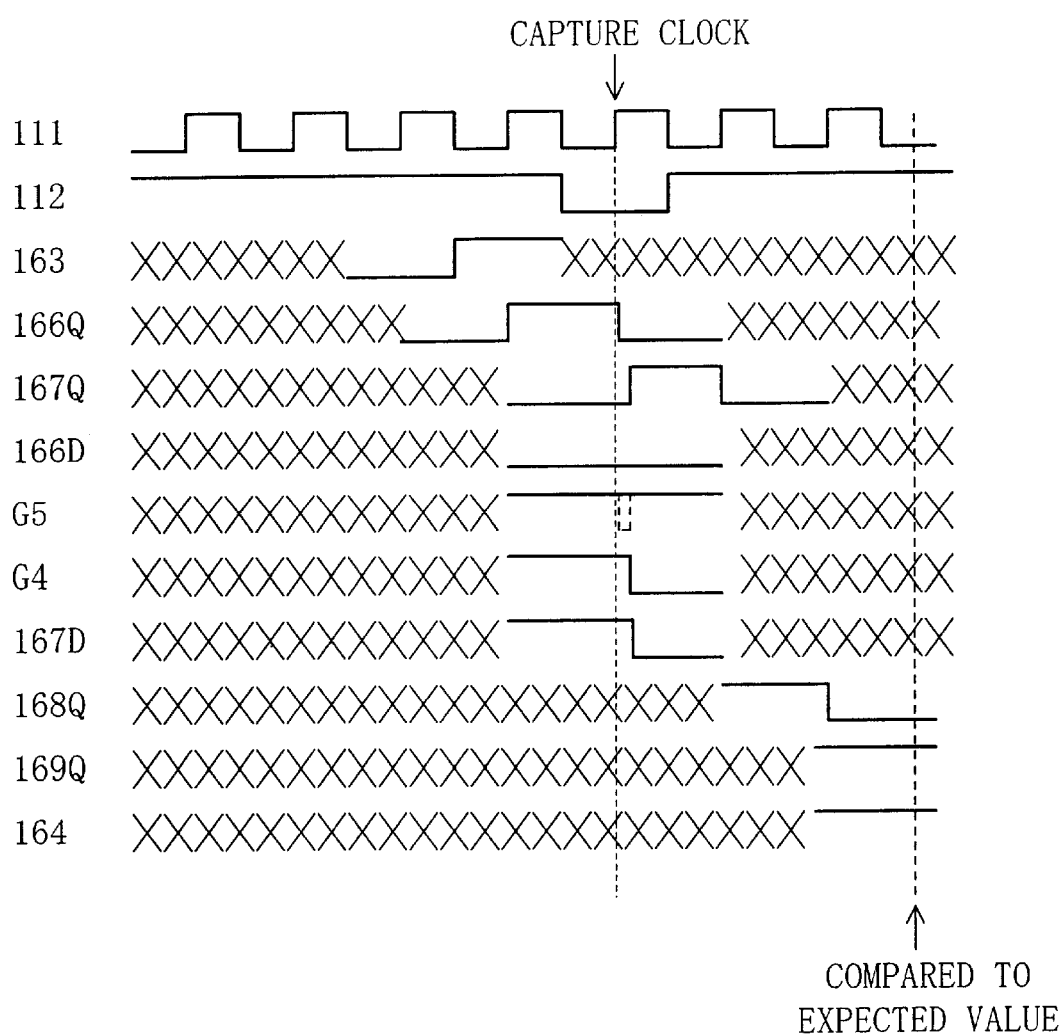
FIG. 10 is a timing diagram for use in illustrating the second embodiment of the inventive testing method.

Next, it will be described with reference to FIGS. 6, 8 and 10 how to test the semiconductor integrated circuit shown in FIG. 6 using the test pattern generated for the path (173→G4→177) in this manner. FIG. 10 is a timing diagram illustrating waveforms at respective terminals where the test pattern generated (with no omissions) is applied to the circuit shown in FIG. 6 following the procedure shown in FIG. 8. In FIG. 10, the waveform of each terminal shown in FIG. 6 is identified by the same reference numeral or sign. It should be noted that G4 and G5 represent the output waveforms of the NAND and OR gates G4 and G5, respectively.

First, in Step 181, the test pattern generated is input to the clock, scan-enable, external input and scan-in terminals 111, 112, 161 and 163. Hereinafter, it will be described with reference to FIG. 10 how the semiconductor integrated circuit operates responsive to this test pattern. As shown in FIG. 10, the circuit is performing a scan-in operation while the signal level at the scan-enable terminal 112 is "1". And when the signal level at the scan-enable terminal 112 falls to zero, the circuit finishes the scan-in operation and restarts its normal operation.

At this point in time, the Q outputs of the scan flip-flops 166 and 167 are "1" and "0", respectively, so the path (167Q→G4→167D) (which is equivalent to the path (173→G4→177) shown in FIG. 7) is now being sensitized. On the other hand, the D inputs of the scan flip-flops 166 and 167 are "0" and "1", respectively, at this time. When a clock pulse (labeled as "capture clock" in FIG. 10) is input in such a state, the Q output of the scan flip-flop 167 rises from "0" to "1", while the Q output of the scan flip-flop 166 falls from "1" to "0". As a result, the signal level transition "from zero to one" is propagated while the path (167Q→G4→167D) is still being sensitized. This zero-to-one transition corresponds to a one-to-zero transition at the D input terminal of the scan flip-flop 167, which is the end point of the path (167Q→G4→167D). Normally, the Q output of the scan flip-flop 167 is one when the capture clock pulse is input thereto. But if the transition propagated through the path (167Q→G4→167D) is not latched successfully at the end point of the path, i.e., the D input terminal of the scan flip-flop 167, then a hold error occurs. That is to say, since the changed value "0", not the original level "1", is latched erroneously at the D input terminal of the scan flip-flop 167, the Q output of the scan flip-flop 167 becomes "0". Accordingly, the Q output of the scan flip-flop 167 is normally "1" but is "0" should the hold error have occurred.

Next, in Step 182, the signal level at the scan-out terminal 164 is monitored by performing a scan-out operation (as indicated by "compared to expected value" in FIG. 10). If the level monitored at the scan-out terminal 164 is the same as the expected value "1", then the circuit under test is judged as a GO in Step 183. Alternatively, if the monitored level is "0" as opposed to the expected value, then the circuit under test is judged as a NO-GO.

By performing these processing steps in this manner, even if an error has occurred on the selected path (167Q→G4→167D) due to a process-induced defect, the fault can be identified.

To sensitize the path (167Q→G4→167D), the output of the OR gate G5 needs to be kept at "1" at a time before or after the capture clock pulse is input. However, it should be noted that the output of the OR gate G5 might be zero for a short period of time (as indicated by the broken line in FIG. 10). This is because a hazard might occur depending on the conditions just after the capture clock pulse has been input. As described above, responsive to the capture clock pulse, the Q outputs of the scan flip-flops 166 and 167 change from 1 to 0 and from 0 to 1, respectively. If the Q output of the scan flip-flop 167 changes earlier than that of the scan flip-flop 166, then a hazard occurs at the OR gate G5. In that situation, while the hazard is present, the path (167Q→G4→167D) is inactive and no signal transition can be propagated therethrough. Accordingly, should the hazard occur, a hold error could not be identified as for the signal transition propagated through the path (167Q→G4→167D).

That is to say, to identify such a hold error for the signal transition propagated through the path (167Q→G4→167D), the output level change of the scan flip-flop 167 should be later than that of the scan flip-flop 166. Consequently, compared to the test pattern generated for the path (169Q→G1→169D) in the first embodiment, the circuit cannot be tested so accurately.

Embodiment 3

Figure 5:
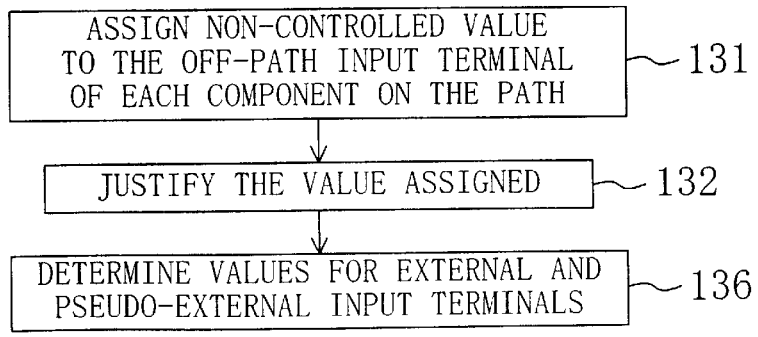
FIG. 5 is a flowchart illustrating the details of a path sensitizing step 105" according to a third embodiment of the present invention.

FIG. 5 is a flowchart illustrating an alternative embodiment for the path sensitizing step 105 shown in FIG. 1. The path sensitizing step 105" shown in FIG. 5 includes the same processing steps as the counterparts shown in FIG. 3, so each of those common processing steps is identified by the same reference numeral.

Hereinafter, a method for generating a test pattern for a semiconductor integrated circuit according to the third embodiment of the present invention will be described with reference to FIGS. 1, 2, 5, 6 and 7.

It should be noted that this third embodiment attempts to generate a test pattern for the path (174→G5→G6→178), for which no test pattern can be generated successfully according to the first or second embodiment.

First, in Step 101, it is found that there is one more path yet to be processed (174→G5→G6→178). So in the next step 102, this path (174→G5→G6→178) is selected.

Then, Step 103 is performed. Specifically, first, in Step 121, an initial value of "0" is assigned to the start point of the selected path, i.e., the pseudo-external input terminal 174. Next, in Step 122, the inverted version "1" of the initial value "0" is tentatively assigned to the pseudo-external output terminal 178 associated with the start point 174 of the path. Then, in Step 123, the value "1" assigned to the pseudo-external output terminal 178 in the previous step 122 is justified to see if this value "1" and the other value at associated input terminals 161, 173 and 174 realize the intended OR and NOR logic. In the illustrated example, the two inputs of the NOR gate G6 should both be "0". Accordingly, to realize the intended OR logic, the two inputs of the OR gate G5 must also be "0". However, since the value "0" has been assigned to the pseudo-external input terminal 174 in Step 121, the value "1" assigned to the pseudo-external output terminal 178 in Step 122 has been justified non-contradictorily.

Subsequently, in Step 104, it is decided that the generated signal level transition has been affirmed as a result of Steps 121 through 123. Accordingly, the selected path is tentatively sensitized in the next step 105". In this step 105", first, a non-controlled value of "0" is assigned in Step 131 to the respective off-path input terminals of the OR and NOR gates G5 and G6 on the selected path. Next, in Step 132, this non-controlled value "0" assigned in the previous step 131 is justified to see if this value and the other value at the associated input terminals 161, 173 and 174 realize the intended OR and NOR logic. In the illustrated example, the off-path input terminals of the OR and NOR gates G5 and G6 are connected to the pseudo-external and external input terminals 173 and 161, respectively. Thus, the value "0" assigned to the pseudo-external and external input terminals 173 and 161 has been justified, because the intended OR and NOR logic is realized. Then, in Step 136, the value "0" assigned to the pseudo-external and external input terminals 173 and 161 is affirmed.

Accordingly, in Step 106, it is decided that the attempted path sensitization was successful as a result of Steps 131, 132 and 136. Thus, the process advances to Step 107 to obtain an expected value. Specifically, in Step 107, the value "1", justified in Step 122 for the pseudo-external output terminal 178 located at the end point of the selected path, is adopted as the expected value of the path (174→G5→G6→178).

Finally, in Step 108, the values "0", "0", "0" and "1" determined for the external input terminal 161 and pseudo-external input and output terminals 173, 174 and 178, respectively, in Steps 105 and 107 are transformed into a scan pattern. In this manner, a test pattern, applicable to the original circuit shown in FIG. 6, is generated. In the illustrated example, the pseudo-external input and output terminals 173, 174 and 178 correspond to the outputs of the scan flip-flops 167 and 166 and the input of the scan flip-flop 166, respectively. Accordingly, considering the connection order of the scan chain (i.e., scan-in terminal 163→scan flip-flops 166, 167, 168 and 169→scan-out terminal 164), the scan pattern is transformed as shown in the following Table 4:

TABLE 4

|  | 111 | 112 | 161 | 163 | 164 |
|---|---|---|---|---|---|
| Time 1 | ↑ | 1 | 0 | X | — |
| Time 2 | ↑ | 1 | 0 | X | — |
| Time 3 | ↑ | 1 | 0 | 0 | — |
| Time 4 | ↑ | 1 | 0 | 0 | — |
| Time 5 | ↑ | 0 | 0 | X | — |
| Time 6 | ↑ | 1 | 0 | X | — |
| Time 7 | ↑ | 1 | 0 | X | — |
| Time 8 | ↑ | 1 | 0 | X | 1 |

In Table 4, "↑" represents the leading edge of a clock pulse, "X" represents don't care, and "-" represents no reference to the expected value.

Among these scan patterns, the patterns for Times 1 and 2 are omissible. Accordingly, the scan pattern may be transformed as shown in the following Table 5:

TABLE 5

|  | 111 | 112 | 161 | 163 | 164 |
|---|---|---|---|---|---|
| Time 1 | ↑ | 1 | X | 0 | — |
| Time 2 | ↑ | 1 | X | 0 | — |
| Time 3 | ↑ | 0 | X | X | — |
| Time 4 | ↑ | 1 | X | X | — |
| Time 5 | ↑ | 1 | X | X | — |
| Time 6 | ↑ | 1 | X | X | 1 |

Then, the process returns to Step 101 again, but there is no path yet to be processed. So the process ends.

By performing the foregoing processing steps of the third embodiment, a test pattern can be generated successfully for the path (174→G5→G6→178), for which no test pattern can be generated successfully by the first or second embodiment.

Figure 11:
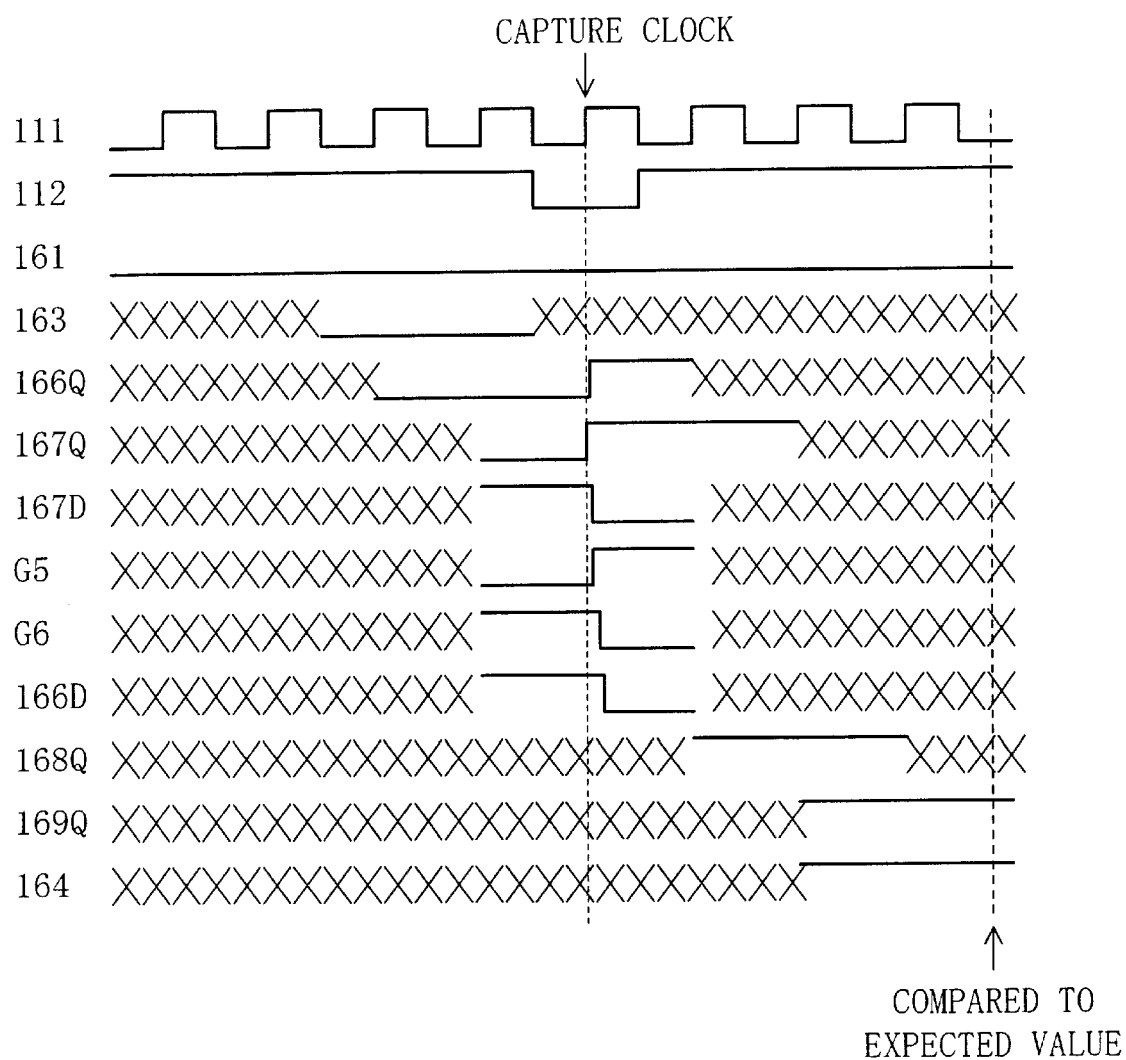
FIG. 11 is a timing diagram for use in illustrating the third embodiment of the inventive testing method.
Figure 12:
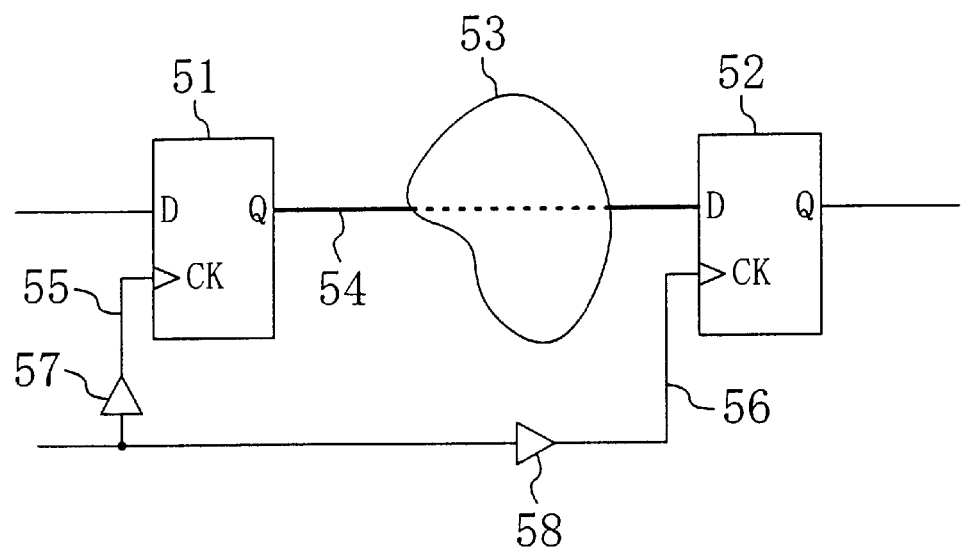
FIG. 12 illustrates a semiconductor integrated circuit.

Next, it will be described with reference to FIGS. 6, 8 and 11 how to test the semiconductor integrated circuit shown in FIG. 6 using the test pattern generated for the path (174→G5→G6→178) in this manner. FIG. 11 is a timing diagram illustrating waveforms at respective terminals where the test pattern generated (i.e., the test pattern shown in Table 4) is applied to the circuit shown in FIG. 6 following the procedure shown in FIG. 8. In FIG. 11, the waveform of each terminal shown in FIG. 6 is identified by the same reference numeral or sign. It should be noted that G5 and G6 represent the output waveforms of the OR and NOR gates G5 and G6, respectively.

First, in Step 181, the test pattern generated is input to the clock, scan-enable, external input and scan-in terminals 111, 112, 161 and 163. Hereinafter, it will be described with reference to FIG. 11 how the semiconductor integrated circuit operates responsive to this test pattern. As shown in FIG. 11, the circuit is performing a scan-in operation while the signal level at the scan-enable terminal 112 is "1". And when the signal level at the scan-enable terminal 112 falls to zero, the circuit finishes the scan-in operation and restarts its normal operation.

At this point in time, the Q outputs of the scan flip-flops 166 and 167 are both "0", so the path (166Q→G5→G6→166D) (which is equivalent to the path (174→G5→G6→178) shown in FIG. 7) is now being sensitized. On the other hand, the D inputs of the scan flip-flops 166 and 167 are both "1" at this time. When a clock pulse (labeled as "capture clock" in FIG. 11) is input in such a state, the Q outputs of the scan flip-flops 166 and 167 rise from "0" to "1".

In this case, after the capture clock pulse has been input, the path (166Q→G5→G6→166D) is deactivated by the OR gate G5. However, the signals at the two input terminals of the OR gate G5 both rise from "0" to "1". Accordingly, the earlier transition at one of these two input terminals is propagated to the output terminal of the OR gate G5. That is to say, the earlier output level change of the scan flip-flop 166 or 167 is propagated as a selected transition through the OR gate G5 and eventually reaches the D input terminal of the scan flip-flop 166. Thus, to propagate the transition through the path (166Q→G5→G6→166D), the output signal of the scan flip-flop 166 should change earlier than that of the scan flip-flop 167.

The zero-to-one transition at the start point of the path (166Q→G5→G6→166D) corresponds to a one-to-zero transition at the D input terminal of the scan flip-flop 166, which is the end point of the path (166Q→G5→G6→166D). Normally, the Q output of the scan flip-flop 166 is one when the capture clock pulse is input thereto. However, if the transition propagated through the path (166Q→G5→G6→166D) is not latched successfully at the end point of the path, i.e., the D input terminal of the scan flip-flop 166, then a hold error occurs. That is to say, since the changed value "0", not the original level "1", is latched erroneously at the D input terminal of the scan flip-flop 166, the Q output of the scan flip-flop 166 becomes "0". Accordingly, the Q output of the scan flip-flop 166 is normally "1", but is "0" should the hold error have occurred.

Next, in Step 182, the signal level at the scan-out terminal 164 is monitored by performing a scan-out operation (as indicated by "compared to expected value" in FIG. 11). If the level monitored at the scan-out terminal 164 is the same as the expected value "1", then the circuit under test is judged as a GO in Step 183. Alternatively, if the monitored level is "0" as opposed to the expected value, then the circuit under test is judged as a NO-GO.

By performing these processing steps in this manner, even if an error has occurred on the selected path (166Q→G5→G6→166D) due to a process-induced defect, the fault can be identified.

To test the path (166Q→G5→G6→166D), the output signal of the scan flip-flop 166 should change earlier than that of the scan flip-flop 167. However, should the output signal of the scan flip-flop 167 have changed earlier than that of the scan flip-flop 166, the path (167Q→G5→G6→166D), not the (166Q→G5→G6→166D), would be tested. The sooner the transition reaches the D input terminal of the scan flip-flop 166 after the clock pulse has been input, the more easily a hold error occurs at the D input terminal of the scan flip-flop 166. Thus, even if the output signal of the scan flip-flop 167 has changed earlier than that of the scan flip-flop 166, it is proved that no hold error will occur on the path (166Q→G5→G6→166D) so long as there is no hold error on the path (167Q→G5→G6→166D) that has been tested instead of the intended path (166Q→G5→G6→166D). This is because the transition is propagated through the intended path (166Q→G5→G6→166D) less fast than the unintentionally selected path (167Q→G5→G6→166D). Accordingly, the path (166Q→G5→G6→166D) can be regarded as having been tested indirectly.

What is claimed is:

1. A method for generating a test pattern for a semiconductor integrated circuit having a first storage device located at a start point of a path selected from the circuit, and a second storage device located at end point of the path selected from the circuit, said second storage device comprising a scan circuit and said path including said scan circuit, said test pattern determines whether or not said second storage device will operate erroneously due to a hold error, said method comprising the steps of:

generating the test pattern so that the path is sensitized and so that a signal, which is transmitted from said first storage device and passes through the path, changes its level within a time period;

wherein said time period is a time period before and after a clock timing of a clock signal, and said clock timing of said clock signal is one clock cycle preceding a clock timing at which the data signal is properly received in the second storage device located at the end point of the path; and wherein an effective path in a capture operation is selected, and said clock signal corresponds to a capture clock signal, said capture clock signal causing a transition in the logic level output by said scan circuit.

2. A method for generating a test pattern for a semiconductor integrated circuit, the semiconductor integrated circuit including:

at least one external input terminal and at least one external output terminal;

a plurality of storage devices including at least one scan circuit; and a combinatorial circuit connected to the external input and output terminals and to the storage devices, the method comprising the steps of:

a) generating a signal level transition for a path selected from the combinatorial circuit by assigning an initial value and a changed value, which is an inverted version of the initial value, to start and end points of the path, respectively, said path including said scan circuit;

wherein output terminals of the combinatorial circuit, which are connected to respective input terminals of the storage devices, are regarded as pseudo-external output terminals, while input terminals of the combinatorial circuit, which are connected to respective output terminals of the storage devices, are regarded as pseudo-external input terminals, and wherein the start point of the selected path is either the at least one external input terminal or one of the pseudo-external input terminals, while the end point of the selected path is one of the pseudo-external output terminals, b) assigning value(s) to the at least one external input terminal and/or at least one of the pseudo-external input terminals and justifying the value(s) so as to sensitize the selected path; and c) obtaining, as an expected value, a value justified for the end point of the selected path where the initial value as-signed to the start point of the path in the step a) has been justified in the step b).

3. The method of claim 2, wherein if the start point of the selected path is one of the pseudo-external input terminals, the step a) is performed so that a value, which is assigned to associated one of the pseudo-external output terminals and is obtained from a value input from one of the storage devices that corresponds to the pseudo-external input terminal, is an inverted version of the initial value.

4. The method of claim 2, wherein the step b) is performed so that a first value, which needs to be justified to sensitize the path, becomes equal to a second value resulting from a third value, where the first value is assigned to one of the pseudo-external input terminals, the second value is assigned to one of the pseudo-external output terminals that is associated with the pseudo-external input terminal, and the third value is input from one of the storage devices that corresponds to the pseudo-external input terminal.

5. The method of claim 2, wherein the step b) comprises the steps of:

assigning value(s) to the at least one external input terminal and/or at least one of the pseudo-external input terminals, the value(s) having to be justified to sensitize the path at a time at which a value assigned to the start point of the selected path is equal to the initial value; and determining whether or not the path is still sensitized even after a clock signal has been input to one of the storage devices that is located at the end point of the selected path.

6. A method for testing a semiconductor integrated circuit having a first storage device located at a start point of a path, and a second storage device located at an end point of the path; said second storage device comprising a scan circuit and said path including said scan circuit; the method comprising the steps of:

generating a test pattern for the circuit to determine whether or not a hold error will occur at an input terminal of said second storage device when a clock signal is input to said second storage device, the test pattern being generated so that the path is sensitized and so that a data signal, which is transmitted from said first storage device and passes through the path, changes its level at a time period before and after the clock signal is input to the said second storage device;

wherein said time period is a time period before and after a clock timing of a clock signal, and said clock timing of said clock signal is one clock cycle preceding a clock timing at which the data signal is properly received in the second storage device located at the end point of the path; and inputting the test pattern to an external terminal of the circuit;

monitoring, at another external terminal of the circuit, a resultant output corresponding to the input test pattern; and judging the circuit as GO or NO-GO based on a result of the monitoring step;

wherein an effective path in a capture operation is selected, and said clock signal corresponds to a capture clock signal, said capture clock signal causing a transition in the logic level output by said scan circuit.

* * * * *